United States Patent [19]
Summers et al.

[11] Patent Number: 5,909,359
[45] Date of Patent: Jun. 1, 1999

[54] APPARATUS FOR A CIRCUIT BOARD EXTENDER

[75] Inventors: Mark David Summers, Phoenix; Ronald Newell Hamilton, Mesa, both of Ariz.; Craig Bayman McIntosh, Lisle, Ill.

[73] Assignee: Motorola, Inc., Schaumburg, Ill.

[21] Appl. No.: 08/934,552

[22] Filed: Sep. 22, 1997

[51] Int. Cl.⁶ ........................................ H05K 7/12
[52] U.S. Cl. .................... 361/748; 361/725; 361/726; 361/727; 361/736; 361/756; 361/829; 361/686; 439/79; 439/639; 439/67; 439/74; 174/250; 174/254; 174/69; 312/223.2; 206/707; 206/706; 206/708; 206/464; 220/23.83; 220/23.86
[58] Field of Search .................... 361/748, 725, 361/726, 727, 736, 740, 741, 747, 749, 752, 753, 756, 829, 686; 439/79, 639, 67, 74; 174/250, 254, 69; 312/223.2; 211/41.17; 228/180.1; 206/707, 706, 708, 464, 465; 220/23.83, 23.86

[56] References Cited

U.S. PATENT DOCUMENTS

| | | | |
|---|---|---|---|
| 3,958,858 | 5/1976 | Silveira, Jr. ........................ | 339/186 M |
| 4,478,331 | 10/1984 | Ruin ........................................ | 206/334 |
| 5,010,446 | 4/1991 | Scannell .................................. | 361/749 |
| 5,317,483 | 5/1994 | Swindler .................................. | 361/801 |
| 5,403,208 | 4/1995 | Felcman et al. ........................ | 439/633 |
| 5,446,619 | 8/1995 | Madsen et al. .......................... | 361/695 |
| 5,592,366 | 1/1997 | Goldman et al. ....................... | 361/796 |
| 5,594,627 | 1/1997 | Le ............................................ | 361/801 |
| 5,626,406 | 5/1997 | Schmid ............................. | 312/334.28 |
| 5,706,173 | 1/1998 | Carney et al. .......................... | 361/740 |

Primary Examiner—Leo P. Picard
Assistant Examiner—David Foster
Attorney, Agent, or Firm—Frank J. Bogacz

[57] ABSTRACT

An apparatus to extend printed circuit board length allows for secure mounting of the printed circuit boards. More particularly, the extender bracket apparatus (30) is for stabilizing small or short, commercial off the shelf (COTS) circuit boards (20) for personal computers (PC). The apparatus will aid in operation of small circuit boards for rugged applications such as high vibration conditions in vehicles. The extender bracket apparatus (30) is first fastened to an adjustable clamp (60), which is then fastened to a COTS circuit board. The adjustable clamp has holes that facilitate attaching to slots in the extender bracket apparatus. The clamp and extender board may have a dielectric surface to prevent electrical conduction. The dielectric can be an adhesive to hold the printed circuit board. The apparatus can then be fastened to a computer chassis (40) for rigidly mounting the circuit board.

12 Claims, 2 Drawing Sheets

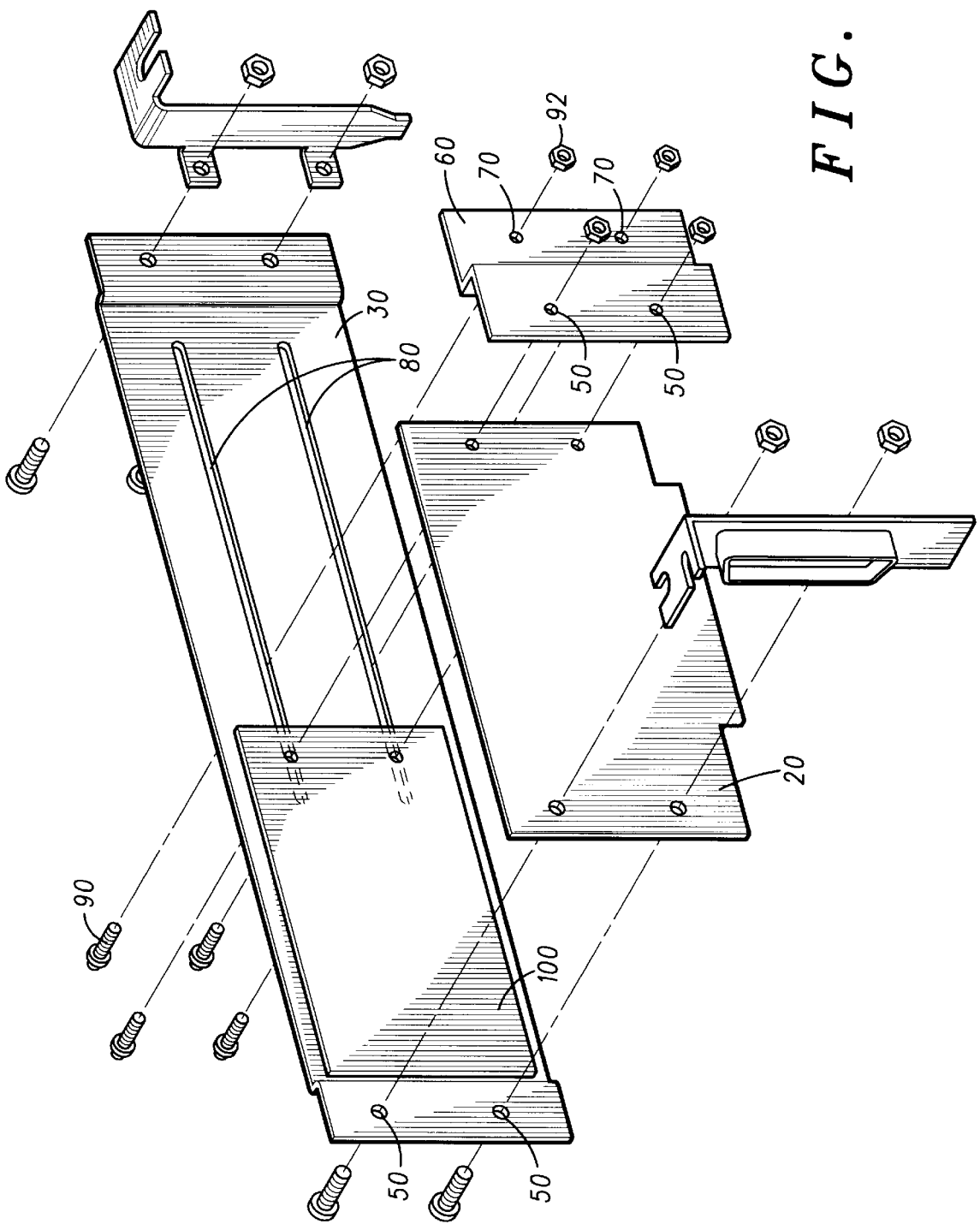

APPARATUS FOR A CIRCUIT BOARD EXTENDER

BACKGROUND OF THE INVENTION

The present invention pertains to printed circuit boards and more particularly to extending small or short personal computer (PC) circuit boards to simplify attachment techniques for operation in rugged environments.

Modern electronics for the military and for other rugged applications are being designed with 'plug and play' printed circuit boards. The 'plug and play' concept enables computers to be updated, upgraded or expanded readily by the addition of a ready to use circuit board. These commercial off the shelf (COTS) printed circuit boards are being used in a variety of computer applications. Many of the COTS personal computer boards are short in length. These non-standard length boards do not lend themselves well to a standardized packaging scheme in a computer.

Included in COTS circuit boards, for example, are boards for personal computers (PC) such as peripheral component interconnect (PCI) circuit boards, industry standard architecture (ISA) circuit boards and other types. The majority of COTS computer printed circuit boards are used in PC applications where the printed circuit boards are mounted in a chassis. A number of these boards are not the full length of the chassis and are therefore difficult to mount.

PC printed circuit boards have inherent problems in packaging for rugged environments. The printed circuit boards are typically mounted with edge connectors at the long end or at the lower side of the printed circuit boards. This can result in rigid body motion problems and severe connector loading.

Short COTS boards can be especially susceptible to movement due to difficulties in mounting. Thus there is a problem of vibration and associated deflections of the card. A poorly restrained circuit board will often deflect under the influence of typical shock and vibration loadings found in rugged environments. This deflection is often refereed to as 'oil canning' and could effect the components on the card, the grounding to the chassis and the edge card connection.

Small or short COTS cards need to be restrained to eliminate these problems. The printed circuit board length, rigidity, weight and the placement of components and printed circuits on the board effect the natural frequency and displacement under vibration. Any conformal coating applied to the printed circuit will also effect the displacement.

If unrestrained, the printed circuit board can fatigue and fail, printed circuits can separate from the board, grounding to the chassis can become intermittent, and electronic components can come loose and fail.

Accordingly, it would be advantageous to have a replaceable arrangement to extend the length of short or small commercial off the shelf (COTS) personal computer PC printed circuit boards. This would aid in being able to rigidly stabilize the COTS boards and eliminate problems with vibration in harsh environments. Included is the need to eliminate the majority of the rigid body motion to reduce the loading on the printed circuit board edge connector, enhance grounding, plus decrease strain on the printed circuit board and the associated electronic components mounted on the printed circuit board.

BRIEF DESCRIPTION OF THE DRAWINGS

FIG. 2 is an isometric view that illustrates one type of extender board and adjustable clamp to interface between a short or small printed circuit board and a computer chassis in accordance with the present invention.

DESCRIPTION OF THE PREFERRED EMBODIMENT

Figure 1:
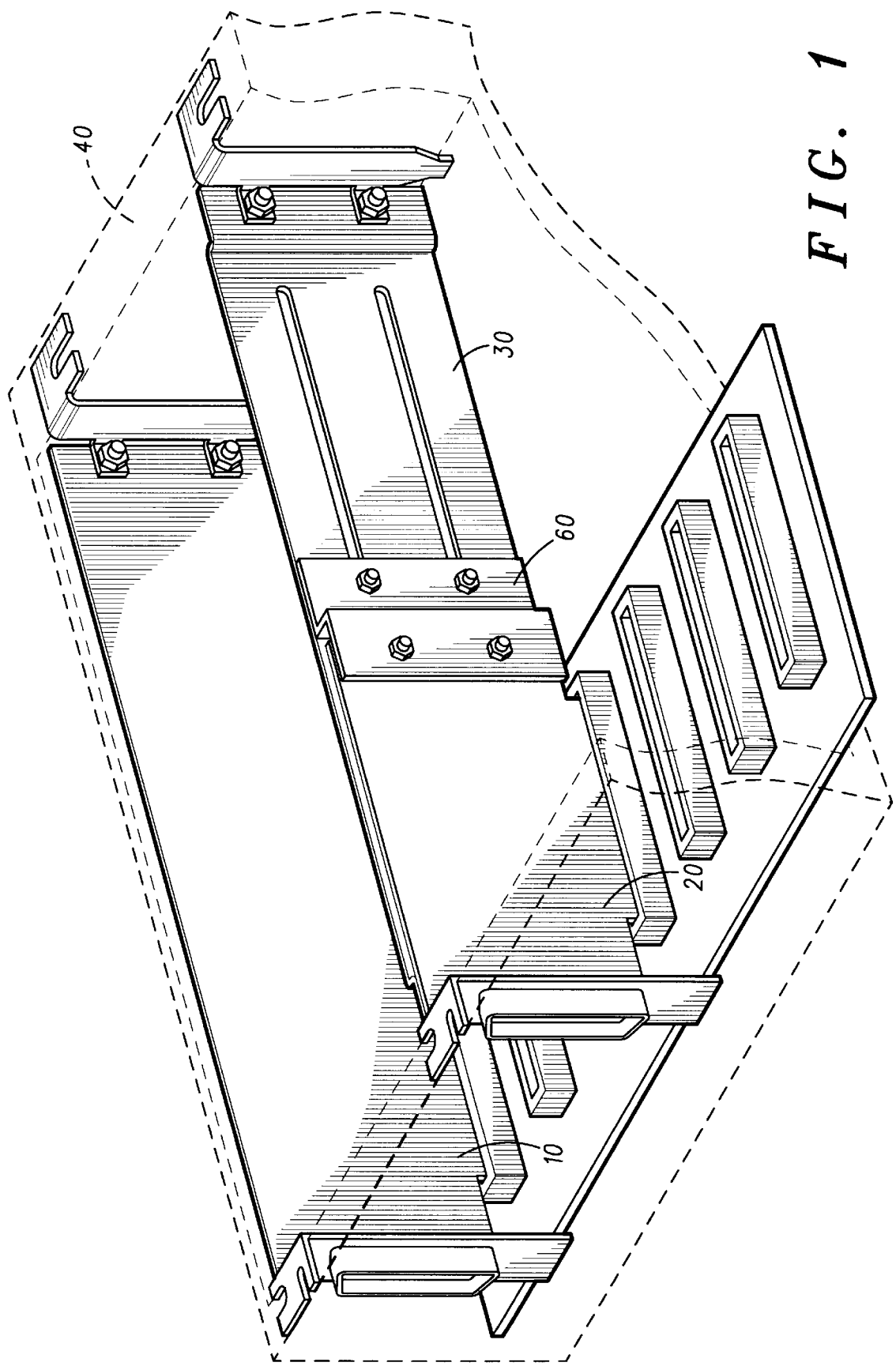
FIG. 1 is an isometric view showing a standard printed circuit board, a short or small circuit board and an extender bracket apparatus in a computer chassis in accordance with the present invention.

In accordance with the present invention, an apparatus to extend printed circuit boards is presented. More particularly, the extender is for stabilizing short or small, commercial off the shelf (COTS) printed circuit boards for personal computers (PC). The apparatus will aid in operation of the short printed circuit boards in rugged environments such as under high vibration conditions.

Referring to FIG. 1, a standard length COTS board 10 and a short COTS board 20 are shown. An extender bracket apparatus 30 to extend a short printed circuit board is shown for typical installation in a computer chassis 40. The extender bracket apparatus 30 can be secured to any equipment chassis with a readily removable printed circuit board mount as will be shown in the FIG. 2 discussion.

The extender bracket apparatus 30 can aid in providing stabilization for a short COTS board 20 such as small personal computer (PC) boards while still allowing for ready replacement of boards. Further rigidity can be obtained by coupling the extender bracket apparatus 30 at both ends with the computer chassis 40.

Referring to FIG. 2, a preferred embodiment of an extender bracket apparatus 30 is shown. Included are card fastener holes 50 and an adjustable clamp 60 to engage the end of a short printed circuit board is shown. The card fastener holes 50 on the adjustable clamp 60 makes provisions for attachment to the short COTS board 20.

Adjustable clamp holes 70 are used to interface with adjustment slots 80 thereby making one extender bracket apparatus 30 compatible with various sizes and length of the short COTS board 20. Fasteners 90 are used with nuts 92 for assembly of the extender bracket apparatus 30. For example, lock tight nuts or wing nuts can be used. A similar type fastener through threaded clamp holes 70 can also be used. Welding or some other type of adhesives such as glue could be used in place of the fasteners 90 and nuts 92. Manufacturing considerations will determine the best approach for fastening the short COTS board 20 to the extender bracket apparatus 30 for various applications.

Electrical insulation 100 can be used on the extender bracket apparatus 30 to isolate the short COTS board 20 from the extender bracket apparatus 30 as well as from the computer chassis 40. The electrical insulation can also be applied to the adjustable clamp 60 for electrical isolation of the short COTS board 20 from the adjustable clamp 60. The electrical insulation 100 can be a dielectric coating, a film or some other simple to apply dielectric material.

For some computer chassis 40 applications, for example, home personal computers where the environment is less severe, the electrical insulation 100 can be a dielectric adhesive. The adjustable clamp 60 and adjustment slots 80 as well as some of the fasteners 90 may then not be needed. The extender bracket apparatus 30 can be attached to the computer chassis 40 by welding or adhesives.

The need for field repair or upgrades, and severe environments makes use of an adhesive less desirable than to use adjustable clamp 60, adjustment slots 80, fasteners 90 and nuts 92.

Stabilization of the short COTS board 20 is further obtained when coupled together with the chassis, for example a computer chassis 40. The extender bracket apparatus 30 will reduce the majority of problems due to printed circuit board deflection known as "oil canning" with operation of personal computers in harsh or military environments.

The extender bracket apparatus 30 thus provides snubbing and damping of the short COTS board 20 motion. The extender bracket apparatus 30 also reduces rigid body loading on card connectors, which can enhance grounding of the circuitry on the short COTS board 20.

The circuit board extender eliminates vibration movement when the equipment is transported by a surface vehicle, aircraft or when located on any vibrating platform. Any vibration restraint of the circuit boards in the computer chassis 40 can then be such that boards could be readily replaced or repaired during manufacture. Also the circuit boards may need to be replaced as upgrades occur or as field repairs need to be made.

The present invention provides for a replaceable arrangement to extend the length of short or small commercial off the shelf (COTS) personal computer PC printed circuit boards. This aids in being able to rigidly stabilize the COTS boards and eliminate problems with vibration in harsh environments. Included is the elimination of the majority of the rigid body motion, which reduces the loading on the printed circuit board edge connector, enhances grounding, as well as decreases strain on the printed circuit board and the associated electronic components mounted on the printed circuit board.

Small or short commercial off the shelf (COTS) computer circuit boards can therefore be packaged for rugged environments such as military applications, for shipping and handling protection, or for computer use by younger children.

Although the preferred embodiment of the present invention has been illustrated, and that form described in detail, it will be readily apparent to those skilled in the art that various modifications may be made therein without departing from the spirit of the invention or from the scope of the appended claims.

What is claimed is:

1. An apparatus for extending a circuit board comprising:
an adjustable clamp coupled to the circuit board;
an extender bracket coupled to the adjustable clamp; and
said adjustable clamp for adjusting a combined length of the circuit board and said extender bracket to be any length equal to or greater than the length of the circuit board;
said extender bracket includes electrical insulation to provide electrical isolation of the extender bracket from the circuit board; and
said adjustable clamp includes an electrical insulation coating to provide electrical isolation of the adjustable clamp from the circuit board and from the extender bracket apparatus.

2. An apparatus for extending a circuit board as claimed in claim 1 wherein said extender bracket includes a plurality of card fastener holes for coupling said extender bracket to said circuit board.

3. An apparatus for extending a circuit board as claimed in claim 2 wherein said extender bracket includes a plurality of card fastener holes for coupling said extender bracket to a computer chassis.

4. An apparatus for extending a circuit board as claimed in claim 3 wherein said extender bracket includes a plurality of adjustment slots for adjusting said length of the circuit board.

5. An apparatus for extending a circuit board as claimed in claim 4 wherein said adjustable clamp includes a plurality of card fastener holes for coupling said adjustable clamp to said circuit board.

6. An apparatus for extending a circuit board as claimed in claim 5 wherein said adjustable clamp is further joined to said plurality of adjustment slots with a plurality of fasteners.

7. An apparatus for extending a circuit board as claimed in claim 6 wherein said adjustable clamp is further joined to said circuit board with a plurality of fasteners.

8. An apparatus for extending a circuit board as claimed in claim 7 wherein said apparatus for extending a circuit board is further coupled to said computer chassis with a plurality of fasteners.

9. An apparatus for extending a circuit board as claimed in claim 1 wherein said adjustable clamp includes a dielectric coating to provide electrical isolation of the adjustable clamp from the circuit board and from the extender bracket apparatus.

10. An apparatus for extending a circuit board as claimed in claim 1 wherein said circuit board is a commercial off the shelf (COTS) printed circuit board.

11. An apparatus for extending a circuit board as claimed in claim 10 wherein said commercial off the shelf (COTS) printed circuit board is a short or small circuit board.

12. An apparatus for extending a circuit board comprising:
an adjustable clamp coupled to the circuit board;
an extender bracket coupled to the adjustable clamp;
said adjustable clamp for adjusting a combined length of the circuit board and said extender bracket to be any length equal to or greater than the length of the circuit board; and
said extender bracket and said circuit board coupled to a chassis to securely hold said circuit board;
said extender bracket includes electrical insulation to provide electrical isolation of the extender bracket from the circuit board; and
said adjustable clamp includes an electrical insulation coating to provide electrical isolation of the adjustable clamp from the circuit board and from the extender bracket apparatus.

* * * * *